US008258464B2

(12) United States Patent
Chen et al.

(10) Patent No.: US 8,258,464 B2

(45) Date of Patent: Sep. 4, 2012

(54) MASS SPECTROMETER AND METHODS FOR DETECTING LARGE BIOMOLECULES

(75) Inventors: Chung-Hsuan Chen, Taipei (TW); Chien-Hsun Chen, Yingge Township (TW); Jung-Lee Lin, Banqiao (TW); Ming-Lee Chu, Xizhi (TW)

(73) Assignee: Academia Sinica, Taipei (TW)

( * ) Notice: Subject to any disclaimer, the term of this patent is extended or adjusted under 35 U.S.C. 154(b) by 188 days.

(21) Appl. No.: 12/785,945

(22) Filed: May 24, 2010

(65) Prior Publication Data

US 2011/0284733 A1 Nov. 24, 2011

(51) Int. Cl.
*H01J 49/34* (2006.01)
*H01J 37/244* (2006.01)

(52) U.S. Cl. ......... 250/282; 250/281; 250/292; 250/397

(58) Field of Classification Search .................. 250/281, 250/282, 292, 397
See application file for complete search history.

(56) References Cited

U.S. PATENT DOCUMENTS 5,572,022 A 11/1996 Schwartz
5,796,100 A 8/1998 Palermo
6,262,638 B1 7/2001 Scherer
6,294,790 B1 * 9/2001 Weinberger .................... 250/397
7,329,866 B2 2/2008 Wang
7,456,398 B2 * 11/2008 Senko et al. .................. 250/292
2005/0153341 A1 7/2005 Alexander
2007/0272852 A1 11/2007 Miller
2008/0149821 A1 6/2008 Senko

FOREIGN PATENT DOCUMENTS

WO WO2009086642 A1 7/2009

OTHER PUBLICATIONS

Qin, Anal Chem 1996 vol. 68, pp. 2108-2112.
Sternglass, Physical Review, V 108, No. 1, 1957, p. 1-12.
Aarset, Journal of Applied Physics, vol. 25, No. 11, 1954, p. 1365-1368.
Hill, Physical Review, V 55, 1939, p. 463-470.
Geno, International Journal of Mass Spectrometry and Ion Processes, 92 (1989) 195-210.
Brunelle, International Journal of Mass Spectrometry and Ion Processes 126 (1993) 65-13.
Martens, Rapid Communications in Mass Spectrometry, vol. 6, 147-157 (1992).
Hellweg, Surf. Interface Anal. 2008; 40: 198-201.
Slodzian, Surface Science V 48 (1975) 161-186.
Gnaser, International Journal of Mass Spectrometry and Ion Processes, 61 (1984) 81-86.
Peng, Anal. Chem. 2008, 80, 2524-2530.
Nazabal, Anal. Chem. 2006, 78, 3562-3570.
Wells, Ultramicroscopy 42-44 (1992) 1200-1203.
Alton, Rev. Sci. Instrum. 59 (7), 1988, p. 1039-1044.
Wenzel, Anal. Chem. 2005, 77, 4329-4337.
Twerenbold, Proteomics 2001, 1, 66-69.
Chang, Annu. Rev. Anal. Chem., 2009, 2:169-85.

* cited by examiner

*Primary Examiner* — Jack Berman

(74) *Attorney, Agent, or Firm* — Eckman Basu LLP

(57) ABSTRACT

A mass spectrometer and methods for obtaining the mass spectrum of a single macromolecular or biomolecular ion in a mass spectrometer. The methods include creating single macromolecular or biomolecular primary ions in an ion trap by ionization of a macromolecule or biomolecule; ejecting half of the primary ions for detection with a first charge detector; ejecting half of the primary ions to impact upon a conversion dynode, thereby creating secondary ions for detection with charge amplification detector such as a channeltron or an electromultiplier or an MCP.

32 Claims, 12 Drawing Sheets

C60 bombardment

Cyto C bombardment

MASS SPECTROMETER AND METHODS FOR DETECTING LARGE BIOMOLECULES

TECHNICAL FIELD OF THE INVENTION

This invention relates to the field of mass spectrometry. In particular, this application relates to methods for detecting macromolecules and single large biomolecular ions in mass spectrometry. More particularly, this application relates to secondary ion emission for detection of single large macromolecular and biomolecular ions.

BACKGROUND OF THE INVENTION

Mass spectrometry is a powerful tool for identifying a molecule or ion by its mass-to-charge ratio. A limitation of mass spectrometry is the difficulty in measuring biomolecules or macromolecules of very high mass-to-charge ratio.

In general, a mass spectrometer includes three major components: an ionizer, a mass-to-charge ratio analyzer, and an ion detector. A mass spectrometer can only be used to detect a charged particle in the gas phase. A large biomolecule having no vapor pressure can therefore be difficult or impossible to detect.

Recent advances in the detection of large biomolecules include matrix-assisted laser desorption/ionization (MALDI) and electrospray ionization (ESI). A drawback of ESI for large biomolecules is that the mass spectrum can be complex and difficult to interpret because the ions produced from large biomolecules may have several different charges. For a mixture of biomolecules, a pre-separation method such as liquid chromatography is often needed for ESI analysis.

Further, while MALDI typically provides singly charged ions, it remains difficult to measure ions with high mass-to-charge ratio because the signal can be low to zero. This is because the signal is normally detected via the generation of secondary electrons in the detector. The efficiency of producing secondary electrons from large biomolecules can be low to zero.

Secondary electrons are ejected when primary ions are used to penetrate an impact material in a detector. Secondary electrons are produced when primary ions lose their energy in various types of collision processes. One drawback is that only a small fraction of secondary electrons may reach the surface. See e.g., Sternglass, E. J. *Phys. Rev.* 1957, 108, 1-12. Further, as shown in FIG. 1, the secondary electron emission coefficient, γe, for helium ions and protons decreases when the primary ions penetrate too deeply. See e.g., Aarset et al. *J. Appl. Phys.* 1954, 25, 1365; Hill et al. *Phys. Rev.* 1939, 55, 463.

Primary ions generated with large biomolecules cannot penetrate a detector material or lattice and collisions are limited to the surface. Other reports indicate that γe decreases rapidly as the velocity of primary ions decreases. See e.g., Geno et al. *Int. J. Mass Spectrom. Ion Processes* 1989, 92, 195-210. In conventional mass spectrometers, when the molecular weight of a biomolecule is above about 10 kDa and the kinetic energy is about 18 keV, the secondary electron emission coefficient γe can be less than one. See e.g., Brunelle et al. *Int. J. Mass spectrom. Ion Processes* 1993, 126, 65-73 In general, when the molecular weight of a molecule is above about 50-200 kDa, the conventional mass spectrometer may have difficulty detecting a signal.

Secondary electrons can be amplified by an electron amplification detector such as an electron multiplier (EM), a channeltron or a microchannel plate (MCP). These electron amplification detectors may have a gain of about 1 million to 100 million, so that one single electron can be detected. For relatively small ions with low mass-to-charge-ratio, such as m/z<100, the number of secondary electrons produced may be greater than one when the ion energy is about 30 keV or greater. Thus, an ion with low mass-to-charge ratio may be detected when the ion energy can be raised up to about 30 keV.

Generating secondary electrons with large biomolecular ions can be difficult because the efficiency of producing secondary electrons depends strongly on the velocity of the ion. When the ion velocity is low, the efficiency of secondary electron ejection can be low to zero.

For a fixed ion energy, the velocity of the ion is proportional to the inverse of the square root of mass-to-charge ratio (m/z). In MALDI, the number of charges on the biomolecular ion is usually equal to one; z=1, therefore the velocity of the ion is proportional to the inverse of the square root of mass. Consequently, when the ion mass increases by 10,000, the velocity decreases by 100 and secondary electron ejection efficiency is greatly reduced.

For a biomolecular ion with a mass-to-charge ratio of 1,000,000, the efficiency for secondary electron ejection can be much less than 0.0001. Under these circumstances, overall detection efficiency in the mass spectrum becomes very low. To detect a biomolecular ion of this size under those circumstances, it may be required to produce more than 10,000 ions.

For example, secondary electron ejection efficiency is near zero when the ion velocity is lower than $1\times10^6$ cm/sec. The ion velocity can be estimated with the equation $v=(2z\ e\ U/m)^{0.5}$, where z is the number of charges on the ion, e is the charge of an electron, namely $1.6\times10^{-19}$ coulomb (C), U is the terminal voltage, and m is the mass of the ion. For a singly charged ion of bovine serum albumin (BSA) of mass 66 kDa and an acceleration voltage of 25 kV, the velocity would be $8.5\times10^5$ cm/sec. Because this is below $1\times10^6$ cm/sec, it is difficult or impossible to detect ions with m/z higher than about 66 kDa using an electron amplification detector.

Secondary ion emission has been tried to detect large biomolecules. See e.g., Martens et al. *Rapid Comm Mass Spectrom,* 1992, 6, 147-157. For molecules having mass from about 5 kDa to about 100 kDa and kinetic energy of about 20 keV, the probability of secondary electrons [P=1−P(0)] decreases very rapidly when the molecular weight increases. On the other hand, the probability of secondary ions is close to unity in this range. See e.g., Hellweg et al. *Surf Interface Anal.* 2008, 40, 198-201. A significant problem is that the secondary ion coefficient is completely unknown.

In sum, it is difficult or impossible to detect biomolecules having molecular weight greater than about 50-200 kDa using secondary electron detection in a conventional mass spectrometer.

There is a need for methods for detecting large biomolecules using a mass spectrometer. There is also a need for a detector apparatus and arrangement for a mass spectrometer that can detect large biomolecular ions. There is a further need for a mass spectrometer apparatus and methods capable of detecting a single large biomolecular ion.

SUMMARY OF THE INVENTION

Embodiments of this invention can provide methods for detecting large biomolecules using a mass spectrometer. This invention further provides arrangements of components for a mass spectrometer and detector apparatus that can detect large biomolecular ions, including a single large biomolecular ion.

In some aspects, the methods of this disclosure can provide the mass spectrum of a large biomolecular ion with much greater sensitivity than conventional methods.

In further aspects, this invention provides a novel apparatus and methods for detecting the secondary ions from large biomolecular ions by using two identical detectors to precisely measure the secondary ion ejection efficiencies.

In some aspects, this disclosure provides methods for obtaining the mass spectrum of a single macromolecular or biomolecular ion in a mass spectrometer by creating single macromolecular or biomolecular primary ions in an ion trap by ionization of a macromolecule or biomolecule; ejecting half of the primary ions for detection with a first charge detector; ejecting half of the primary ions to impact upon a conversion dynode, thereby creating secondary ions for detection with a second charge detector identical to the first charge detector; and determining the secondary ion conversion coefficient of the biomolecular ion. The secondary ion conversion coefficient may be used to determine the mass spectrum of the single macromolecular or biomolecular ion.

In some embodiments, the macromolecule is an organic polymer.

In some embodiments, the biomolecule may have a mass of from about 10 kDa to about 10,000 kDa. The conversion dynode may be coated with a salt or alkali metal salt, or with NaI, CsI, or $CH_3COONa$. The ionization may be performed by MALDI, electrospray ionization, laser ionization, thermospray ionization, thermal ionization, electron ionization, chemical ionization, inductively coupled plasma ionization, glow discharge ionization, field desorption ionization, fast atom bombardment ionization, spark ionization, or ion attachment ionization. In certain embodiments, the mass spectrum of the single biomolecular ion can be quantitative.

In certain aspects, the secondary ion emission coefficient for the biomolecule may greater than 3, or greater than 10, or greater than 20. The average mass of the secondary ions can be greater than 1 kDa, or greater than 5 kDa.

This invention includes methods for obtaining the mass spectrum of a single macromolecular ion in a mass spectrometer, the method comprising: creating macromolecular primary ions; converting the macromolecular primary ions into secondary ions; determining the secondary ion conversion coefficient of the primary macromolecular ion; obtaining the mass spectrum of the secondary ions; calculating the mass spectrum of the single macromolecular ion using a Poisson distribution based on the peaks in the mass spectrum of the secondary ions.

Embodiments of this invention may further provide a mass spectrometer for determining the mass spectrum of a single biomolecular ion, the mass spectrometer comprising: an ionization unit for creating single biomolecular primary ions of a biomolecule; a first charge detector for directly detecting half of the biomolecular primary ions; a conversion dynode for converting half of the biomolecular primary ions to secondary ions; and a second charge detector identical to the first charge detector for detecting the secondary ions.

DESCRIPTION OF THE DRAWINGS

The following drawings form part of the present specification and are included to further demonstrate certain aspects of the present disclosure, the inventions of which can be better understood by reference to one or more of these drawings in combination with the detailed description of specific embodiments presented herein.

FIG. 4 shows that large biomolecular ions can have a high secondary ion ejection efficiency even with a modest ion energy of about 25 keV.

In FIG. 9, the relationship between consuming sample quantity (1/100 total quantity) and ion number was shown. About 2 ions were detected when 20 attomole of IgG sample was ablated.

In FIG. 11, the Cs ion signal of CsI and $CsCH_3COO$ are similar and CsF is the smallest.

DETAILED DESCRIPTION OF THE INVENTION

Figure 1:
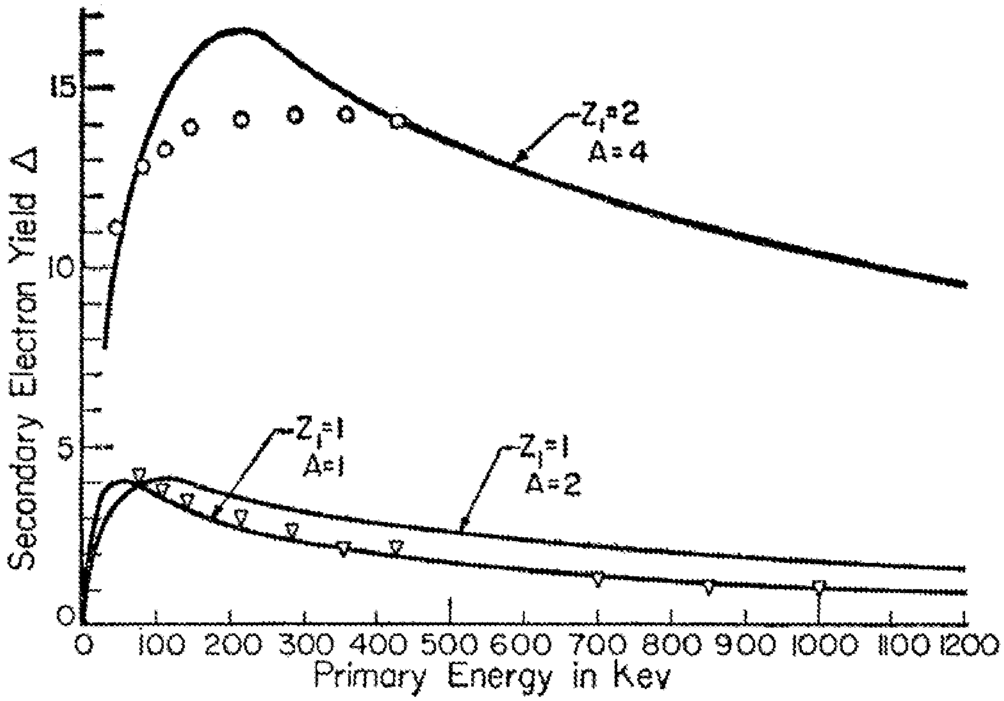
FIG. 1 shows that the secondary electron emission coefficient, γe, for helium ions and protons decreases when the primary ions penetrate too deeply. The upper curve is for helium ions. The lower curves are for protons.

Embodiments of this invention provide novel methods for detecting large biomolecules using a mass spectrometer. This invention further provides arrangements of components for a mass spectrometer and detector apparatus that can detect large biomolecular ions. In some embodiments, this disclosure describes a mass spectrometer apparatus and methods capable of detecting a single large biomolecular ion.

In some aspects, this invention is based in part on our recognition that secondary ion ejection efficiency can be much higher than secondary electron ejection efficiency for an ion with very large mass-to-charge ratio. Secondary ions can be produced from large biomolecular primary ions using a conversion dynode. The secondary ions are smaller than the primary ions and can be detected with greater sensitivity than the primary ions. Thus, the methods of this disclosure can provide measurement of large biomolecular ions with much greater sensitivity than conventional methods.

In further aspects, this invention provides a novel apparatus and methods for detecting the secondary ions from large biomolecular ions by using two identical detectors to precisely measure the secondary ion ejection efficiencies. By measuring the secondary ion ejection efficiencies it can be determined precisely how many secondary ions are produced from each single large biomolecular ion at a particular kinetic energy. This information is used to produce a mass spectrum of the large biomolecular ion with far greater sensitivity than in conventional methods.

In additional aspects, this invention may provide a mass spectrometer apparatus and methods capable of detecting a single large biomolecular ion. The capability to detect a single biomolecular ion advantageously provides methods to obtain the mass spectra of very large biomolecules such as proteins, antibodies, protein complexes, protein conjugates, nucleic acids, oligonucleotides, DNA, RNA, polysaccharides and many others with high detection efficiency.

In some embodiments, the methods of this invention can be used to obtain the mass spectra of nanoparticles, viruses, and other biological components and organelles having sizes in the range of up to about 50 nanometers or greater.

In some variations, the apparatus and methods of this disclosure can provide the mass spectra of organic macromolecules, synthetic organic polymers, pollutant particles and other materials.

Embodiments of this invention can be used to detect the mass spectrum of a very large primary molecular ion with 100% efficiency. This is because the determination of secondary ion ejection efficiencies allows the identification and detection of secondary ion mass peaks which are used to establish the mass spectrum of the large primary molecular ion.

The methods and detector apparatus arrangement of this disclosure can be applied to any mass spectrometer which can produce very large primary molecular ions.

Examples of methods for ionization include laser ionization, MALDI, electrospray ionization, thermospray ionization, thermal ionization, electron ionization, chemical ionization, inductively coupled plasma ionization, glow discharge ionization, field desorption ionization, fast atom bombardment ionization, spark ionization, or ion attachment ionization.

Methods of this invention may provide the mass spectrum of a very large molecular ion with dramatically increased efficiency, and with efficiency comparable to that obtained when detecting small molecular ions by conventional methods.

In comparison to mass spectrometers using conventional cryogenic detection of large molecular ions, the apparatus and methods of this invention do not require the use and storage of cryogenic liquids and have a faster response time.

Methods and Apparatus for Determining Secondary Ion Conversion Efficiency

In order to detect large biomolecules, we have used secondary ion emission. For secondary ion emission, the impacting area of single biomolecule produces rapid and highly localized energy. See e.g., Slodzian, G. *Surf Sci.* 1975, 48, 161; Gnaser, H. *Int. J. Mass Spectrom. Ion Processes* 1984, 61, 81. The high surface temperature at an extremely localized area can provide enough energy for production of a large number of secondary ions from the surface.

Embodiments of this invention provide precise determination of the number of secondary ions produced from a large biomolecular ion. A single large primary biomolecular ion having mass greater than about 100 kDa can provide up to about twenty smaller secondary ions or more, even with a modest primary ion energy of from about 20 keV to about 30 keV.

In the apparatus and methods of this disclosure, all of these smaller secondary ions produced from the large primary biomolecular ion can be captured by an electron amplification detector such as an electron multiplier, channeltron or MCP for secondary electron production and amplification. In some embodiments of this invention, a very large single biomolecular ion with a single charge can be detected with high sensitivity at modest ion kinetic energy.

Figure 2:
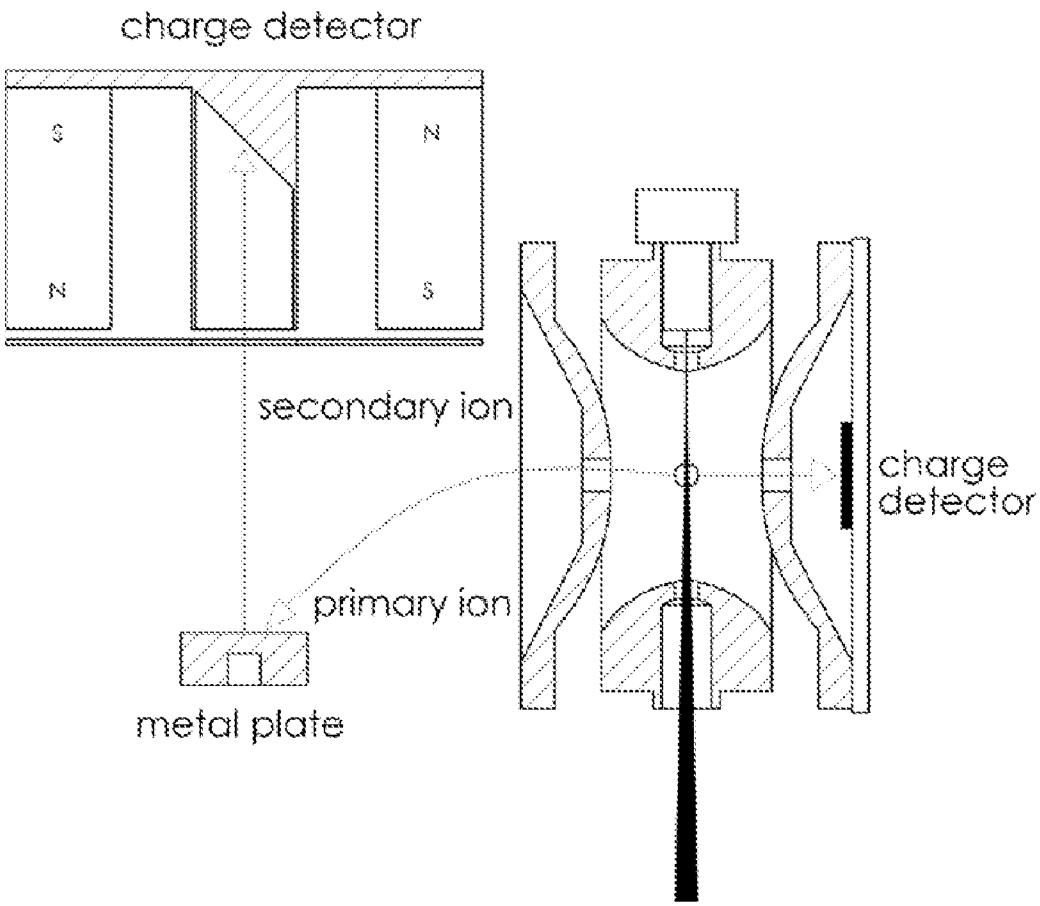
FIG. 2 shows an embodiment of a novel apparatus for precisely detecting secondary ion conversion efficiency. Negative primary ions are produced in MALDI or another ionization method and are trapped in an ion trap. The primary ions are divided into two equal portions, and each portion is ejected through a different exit hole. The primary ions ejected from the right exit hole are measured directly with a primary charge detector without any amplification. The ions ejected from the ion trap through the left exit hole hit a conversion plate. Secondary ions are ejected from the plate and are collected by a secondary charge collector which is identical to the charge collector used for detecting primary ions. The secondary ion conversion efficiency can be taken as the total charge collected from the left side secondary detector compared to the total charge collected from the right side primary collector for the same fixed period of time.

Referring to FIG. 2, a novel apparatus for precisely detecting secondary ion conversion efficiency is shown. Negative primary ions of a large biomolecule are produced in MALDI, ESI or another ionization method capable of producing very large primary molecular ions. The primary ions are trapped in an ion trap. The primary ions are divided into two equal portions, and each portion is ejected into a different exit hole using voltage scanning or frequency scanning. Because the ion trap is symmetric with respect to left and right sides, half of the ejected primary ions go out from the left exit hole and the other half leaves the trap through the right exit hole.

Figure 3:
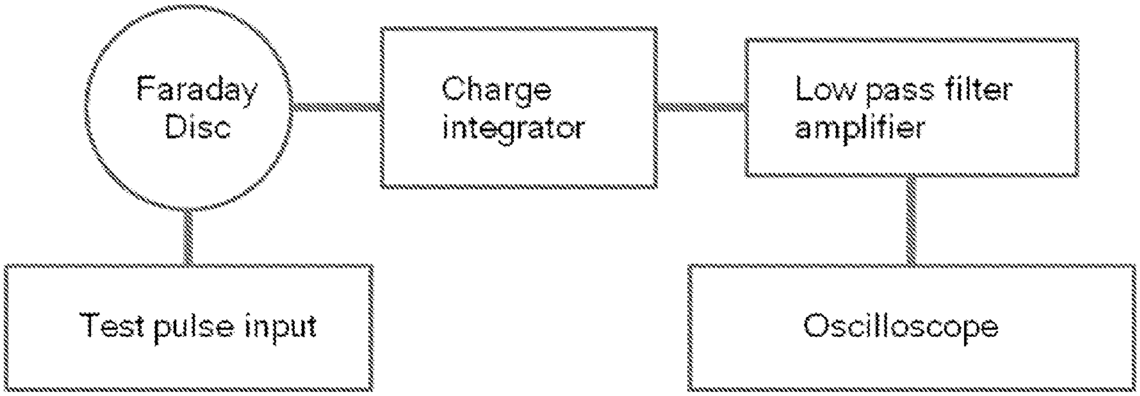
FIG. 3 shows an electronics schematic for the primary charge detector.

The primary ions ejected from the right exit hole are measured directly with a primary charge detector without any amplification. The electronics schematic for the primary charge detector is shown in FIG. 3. See e.g., W.-P. Peng et al., 2008 *Anal. Chem.* Some parameters for the primary charge detector are shown in Table 1.

TABLE 1

| Parameters for the primary charge detector | |
|---|---|
| Charge conversion ratio | 50 electrons/mV |
| Noise voltage | 20 mV rms |
| PCB board size | 44 by 44 mm |
| Faraday disk diameter | 10 mm |

Referring to FIG. 2, the ions ejected from the ion trap through the left exit hole hit a conversion plate which is biased with a positive high voltage which can be from about 10 keV to about 30 keV. Secondary ions are ejected from the plate and collected by another secondary charge collector, such as a Faraday charge collector, which is identical to the charge collector used for detecting primary ions exiting from the right hole of the trap.

In some aspects, this invention solves the problem of unknown secondary ion coefficients by providing methods and apparatus to determine the secondary ion coefficients. The concept for determination of secondary ion emission coefficients is that equal amounts of ions are ejected through two endcaps when a driving frequency is scanned. Primary ions on the right were directly measured with a charge detector, and secondary ions produced from the conversion process were measured with a second charge detector.

It was found experimentally that for masses from about 10 kDa to about 1000 kDa, the secondary ion coefficients were significantly larger than one, and increased with kinetic energy for a fixed mass and molecular weight.

Using the secondary ion coefficients ($\gamma_i$), a theoretical probability for secondary ion emission can be derived from the Poisson distribution. Poisson distribution is described as $P(n)=\gamma_i^n \times (n!)^{-1} \times e^{-\gamma_i}$, where P(n) represents the probability that secondary ion emitted per impact, and n represents the number of secondary ions emitted per impact. The probability of secondary ion emission can be expressed as $P_{sec}=1-P(0)$.

The secondary ion emission probability for the largest molecule IgM ion at 28 keV was 0.997. This indicates that nearly every impact of the single large ion produced secondary ions. In other words, single large biomolecular ion detection can be achieved by detecting small secondary ions.

Some information on secondary ions is given in Nazabal et al. *Anal. Chem.* 2006, 78, 3562-3570.

The secondary ion conversion efficiency for each kind of ion can be taken as the total charge collected from the left side secondary detector compared to the total charge collected from the right side primary collector for the same fixed period of time. The secondary ion conversion efficiency can be determined for a specific ion versus the ion kinetic energy.

Figure 4:
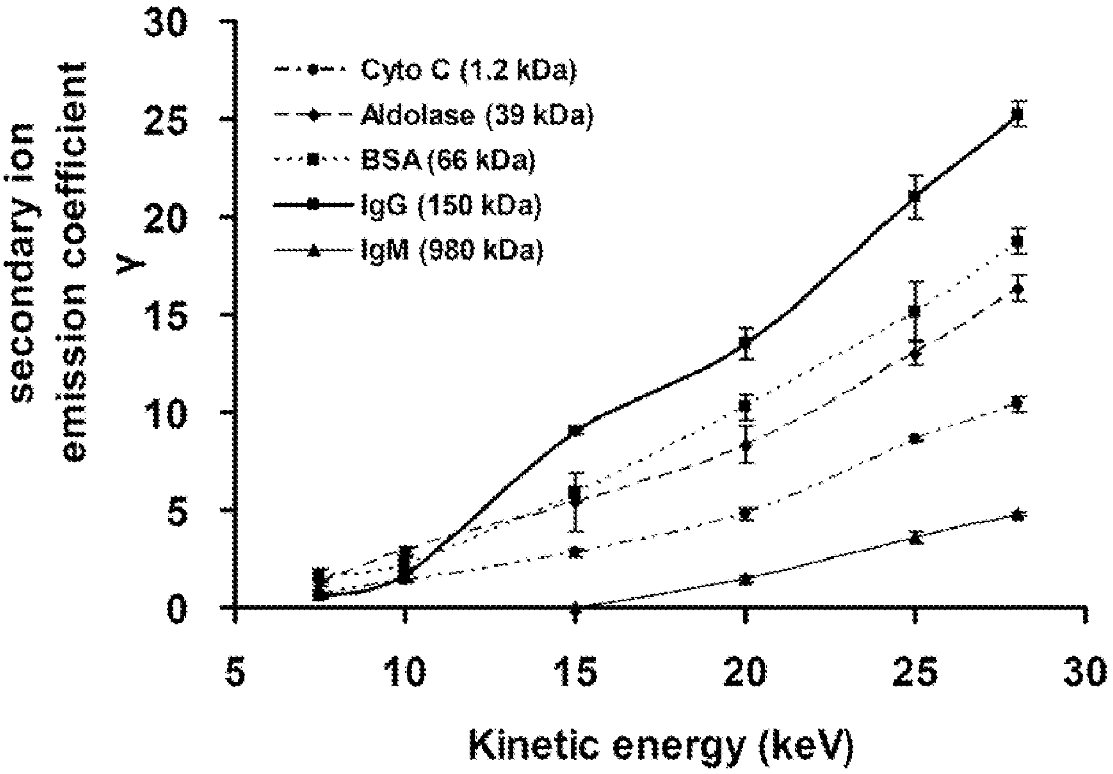
FIG. 4 shows secondary positive ion conversion efficiencies for several different large biomolecules. The x-axis represents the conversion dynode voltage or kinetic energy.

The secondary positive ion conversion efficiencies for several different large biomolecules are shown in FIG. 4. The x-axis represents the conversion dynode voltage or kinetic energy. FIG. 4 shows that these large biomolecular ions have a very high secondary ion ejection efficiency even with a modest ion energy of about 25 keV. For example, for IgG at 25 keV the secondary ion ejection efficiency was about twenty (20). Thus, one IgG ion can produce up to 20 secondary ions, or greater. With these precise measurements of the secondary positive ion conversion efficiencies for several different large biomolecules, the mass spectra of their single biomolecular ions can each be obtained.

In some embodiments of this invention, the mass spectrum can be obtained for a single biomolecule ion having a mass of from about 10 kDa to about 10,000 kDa, or from about 50 kDa to about 5,000 kDa.

In some embodiments, the secondary ion ejection efficiency or secondary ion conversion coefficient can be greater than about 3, or greater than about 5, or greater than about 10, or greater than about 15, or greater than about 20.

Methods for Obtaining Mass Spectra of Large Molecules and Species

Embodiments of this invention include methods to obtain the mass spectrum of a single very large molecular ion of either polarity at high mass-to-charge ratio with nearly 100% detection efficiency. The sum of the molecular weights of all of the smaller secondary ions may be used to reflect the molecular weight of the primary ion.

In general, using the methods and apparatus of this invention, the sum of the molecular weights of all of the smaller secondary ions should not exceed the molecular weight of the original single primary macromolecular or biomolecular ion. For example, for a mass of about 150 kDa and a secondary ion conversion efficiency of 20, the average molecular weight of the smaller secondary ions is about 7.5 kDa. Single ions with a molecular weight of about 7.5 kDa can be readily detected with a kinetic energy of about 25 keV.

In certain embodiments, because the number of ejected secondary ions is 20, the detection efficiency of the single IgG should be 100%. The high secondary ion ejection ratios were obtained for both large positive and negative ions. It is not necessary to identify the molecular weight of every secondary ion.

Figure 5:
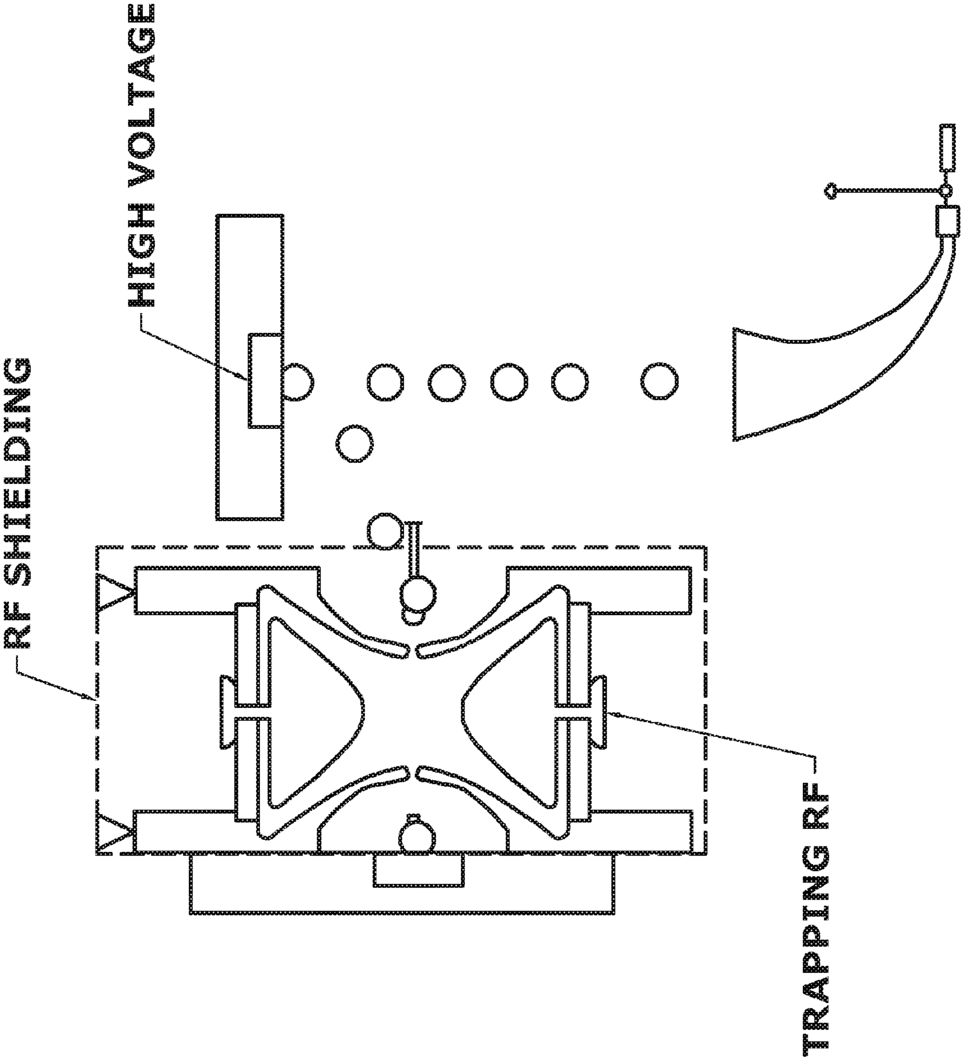
FIG. 5 shows a schematic illustration of an embodiment of a detector arrangement for a mass spectrometer for detecting a large biomolecular ion with an high mass-to-charge-ratio.

In further embodiments, a detector arrangement for a mass spectrometer for detecting a large biomolecular ion with a high mass-to-charge-ratio is shown in FIG. 5. In these embodiments, RF shielding and an amplifying detector for secondary ions are shown.

This disclosure encompasses methods for detecting a very large molecular ion through the determination of the efficiency of ejection of secondary ions of opposite polarity to the input very large molecular ion using a charge amplification detector which may include an MCP, a channeltron, an electron multiplier, or a Daly detector device.

In certain embodiments, the range of mass-to-charge-ratio (m/z) that can be covered is from 1 to 100,000,000 at a modest ion energy less than about 100 keV.

This invention includes methods for obtaining the mass spectra of a wide variety of molecules and species, including large biomolecules, organic polymers, inorganic clusters and small nanoparticles.

The novel methods of this disclosure may be used to detect both positive and negative very large molecular ions with a slightly different design on the biased voltages of the secondary ion converter and the charge amplification detector.

In some embodiments, methods are provided to obtain the mass spectra of non-convalent bonding of large molecule complexes such as protein-protein complexes, DNA-protein complexes, polysaccharide-protein complexes, and many others.

In the following description, reference is made to the accompanying drawings that form a part hereof, and in which is shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are now described. All publications and patents specifically mentioned herein are incorporated by reference for all purposes including describing and disclosing the chemicals, cell lines, vectors, animals, instruments, statistical analysis and methodologies which are reported in the publications which might be used in connection with the invention. All references cited in this specification are to be taken as indicative of the level of skill in the art. Nothing herein is to be construed as an admission that the invention is not entitled to antedate such disclosure by virtue of prior invention.

Before the present materials and methods are described, it is understood that this invention is not limited to the particular methodology, protocols, materials, and reagents described, as these may vary. It is also to be understood that the terminology used herein is for the purpose of describing particular embodiments only, and is not intended to limit the scope of the present invention which will be limited only by the appended claims.

DEFINITIONS

It must be noted that as used herein and in the appended claims, the singular forms “a”, “an”, and “the” include plural reference unless the context clearly dictates otherwise. As well, the terms "a" (or "an"), "one or more" and "at least one" can be used interchangeably herein. It is also to be noted that the terms "comprises," "comprising", "containing," "including", and "having" can be used interchangeably.

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

EXAMPLES

Example 1

Mass Spectrum of a Single IgM Ion

IgM (350 fmole) was chosen to demonstrate single large ion detection ability to 1 MDa. The IgM signal was first obtained in the ion trap mass spectrometer as shown in

Example 2

Mass Spectrum of a Single IgG Ion

Figure 6:
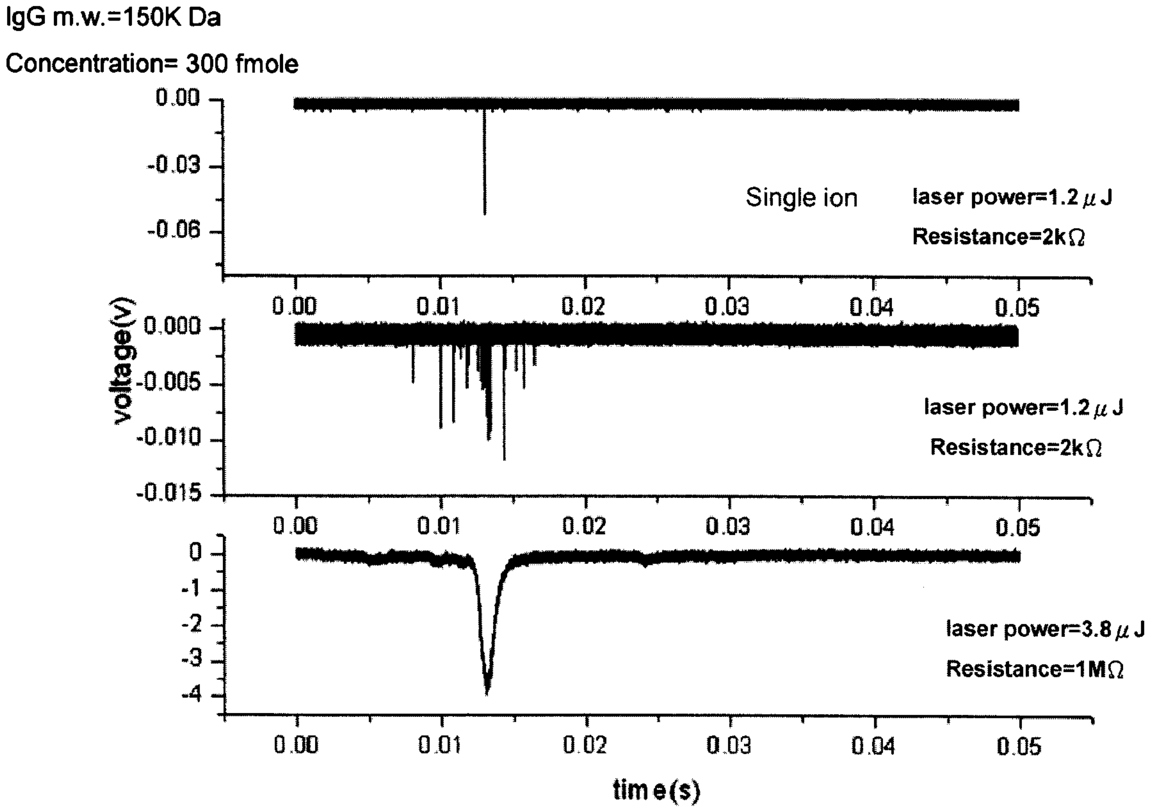
FIG. 6 shows an experimental mass spectrum of a single IgG ion. The single IgG ion had an m/z of about 150 kDa. The top spectrum shows the single IgG ion detection. The second spectrum shows that each secondary ion gave a single peak. The lower spectrum was obtained with the detector using a high impedance resistor to get a long collection time to get a smooth spectrum. The spectrum was obtained with the ion accumulation from 15 laser shots.

An experimental mass spectrum of a single IgG ion is shown in FIG. 6. The single IgG ion had an m/z of about 150 kDa. The top spectrum shows the single IgG ion detection. The second spectrum shows each individual ion gave a single peak. Many peaks occurred at a narrow time region. The distribution determined the mass resolution. The lower spectrum was obtained with the detector using a high impedance resistor to get a long collection time to get a smooth spectrum. The spectrum was obtained with the ion accumulation from 15 laser shots.

Example 3

Mass Spectrum of IgG Secondary Ions

Figure 7:
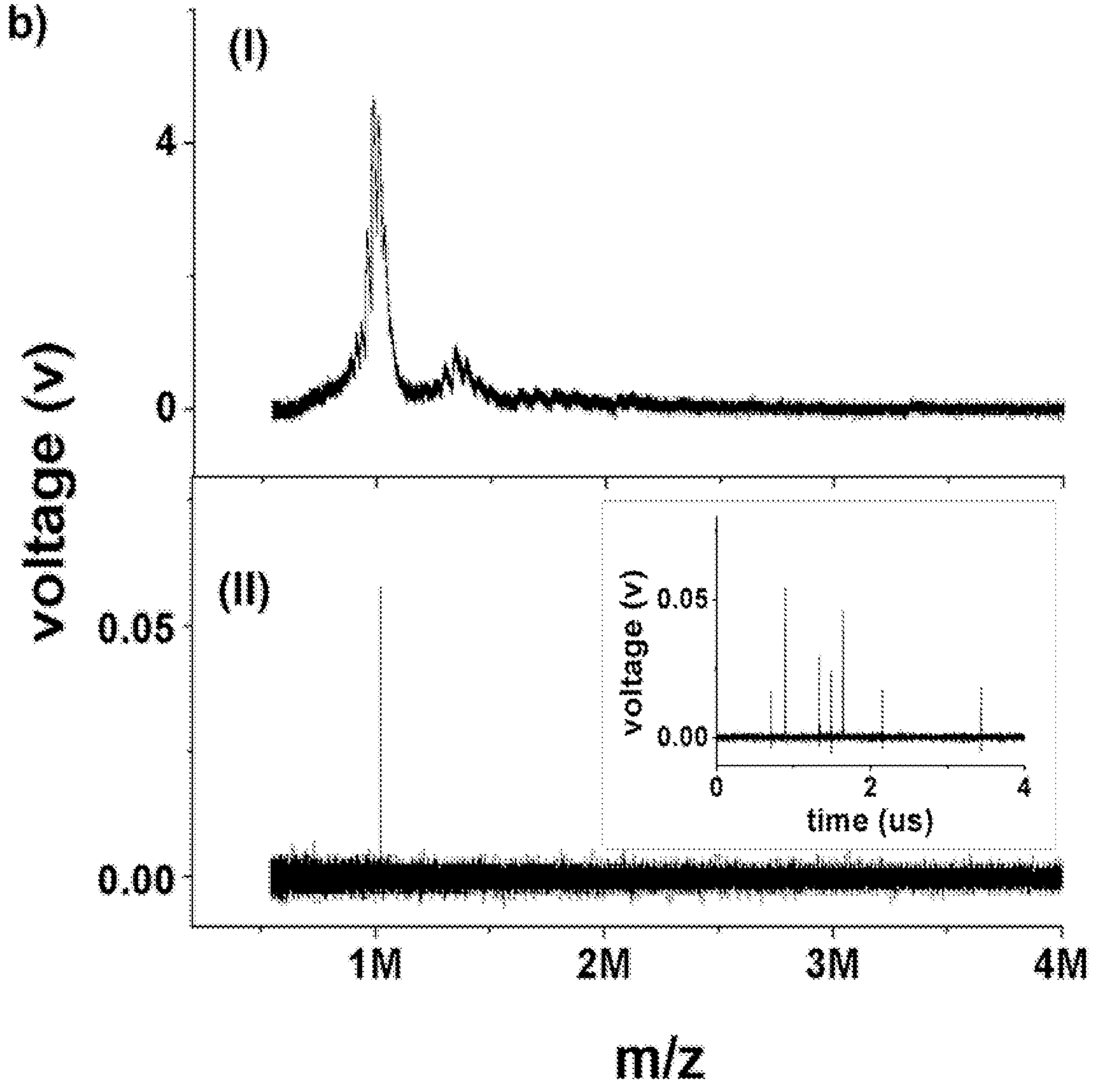
FIG. 7 shows the experimental mass spectra of a single very large molecular IgM ion. The single IgM ion had a mass-to-charge ratio of about 980 kDa. The upper spectrum was obtained with high impedance for the charge amplification detection. The lower spectrum was obtained with the single ion detection. The insert shows the mass spectrum of secondary ions.

The mass spectra of a single very large molecular IgM ion were detected and are shown in FIG. 7. The single IgM ion had a mass-to-charge ratio of about 980 kDa. The ejected IgM secondary ions were measured by a time-of-flight mass analyzer with a short field free drift region. The upper spectrum was obtained with high impedance for the charge amplification detection. The lower spectrum was obtained with the single ion detection. The insert shows the mass spectrum of secondary ions.

Example 4

Mass Spectrum of Antibody-Antigen Complex

Figure 8:
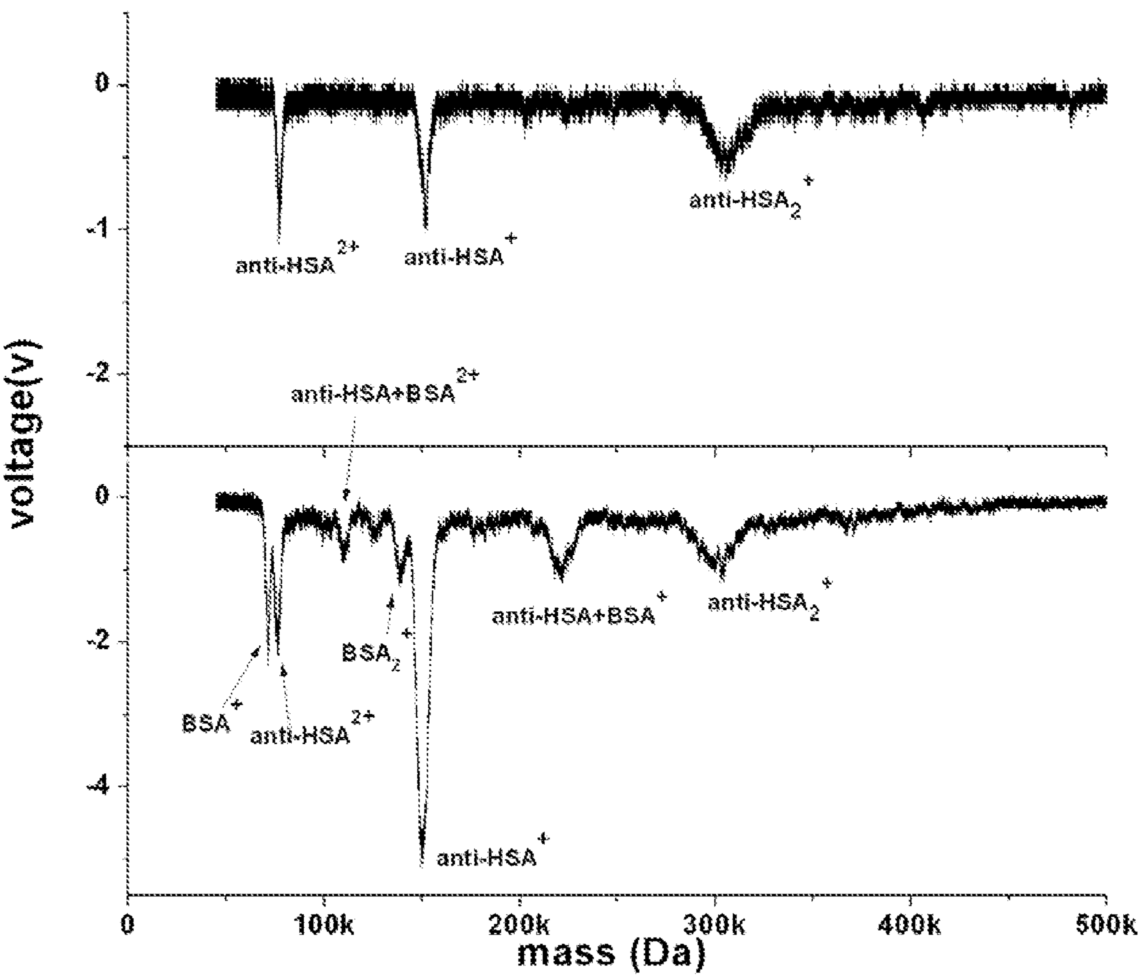
FIG. 8 shows experimental mass spectra of an antibody-antigen complex.

The scheme in FIG. 5 was used to detect an antibody-antigen complex and the mass spectra are shown in FIG. 8. The capability to detect a very small quantity of such a biomolecule complex is useful in biomedical research.

Example 5

Experimental Detection of Secondary Ions

To demonstrate detection of a single large biomolecular ion, a metal plate cleaned with acetone was used to convert a single large ion into several smaller ions. The smaller ions were detected with an electron multiplier.

Figure 9:
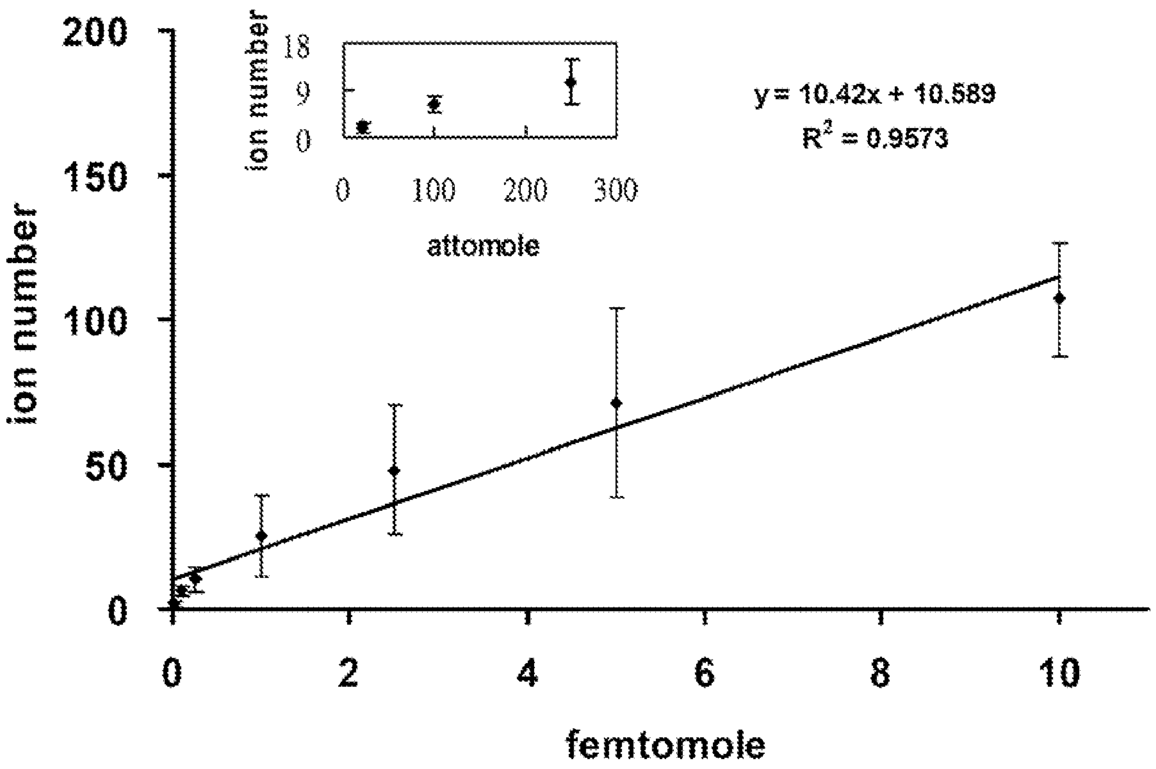
FIG. 9 shows data related to the detection limit for secondary ions from a small quantity of a large biomolecule, IgG. IgG (total quantity from 2 fmole to 1000 fmole) was mixed with Sinapinic Acid (100 nmole).

FIG. 9 shows data related to the detection limit for secondary ions from a small quantity of a large biomolecule. IgG was chose in this experiment, because it is useful in immunoassays and is difficult to detect with conventional mass spectrometry. IgG (total quantity from 2 fmole to 1000 fmole) was mixed with Sinapinic Acid (100 nmole). The laser spot (diameter≈100 μm) covered 1/100 area of the sample spot (diameter≈1 mm). The laser was fired 20 shots on the same area and therefore, the accumulated ions were detected in one scan. In FIG. 9, the relationship between consuming sample quantity (1/100 total quantity) and ion number was shown. About 2 ions were detected when 20 attomole of IgG sample was ablated.

Figure 10:
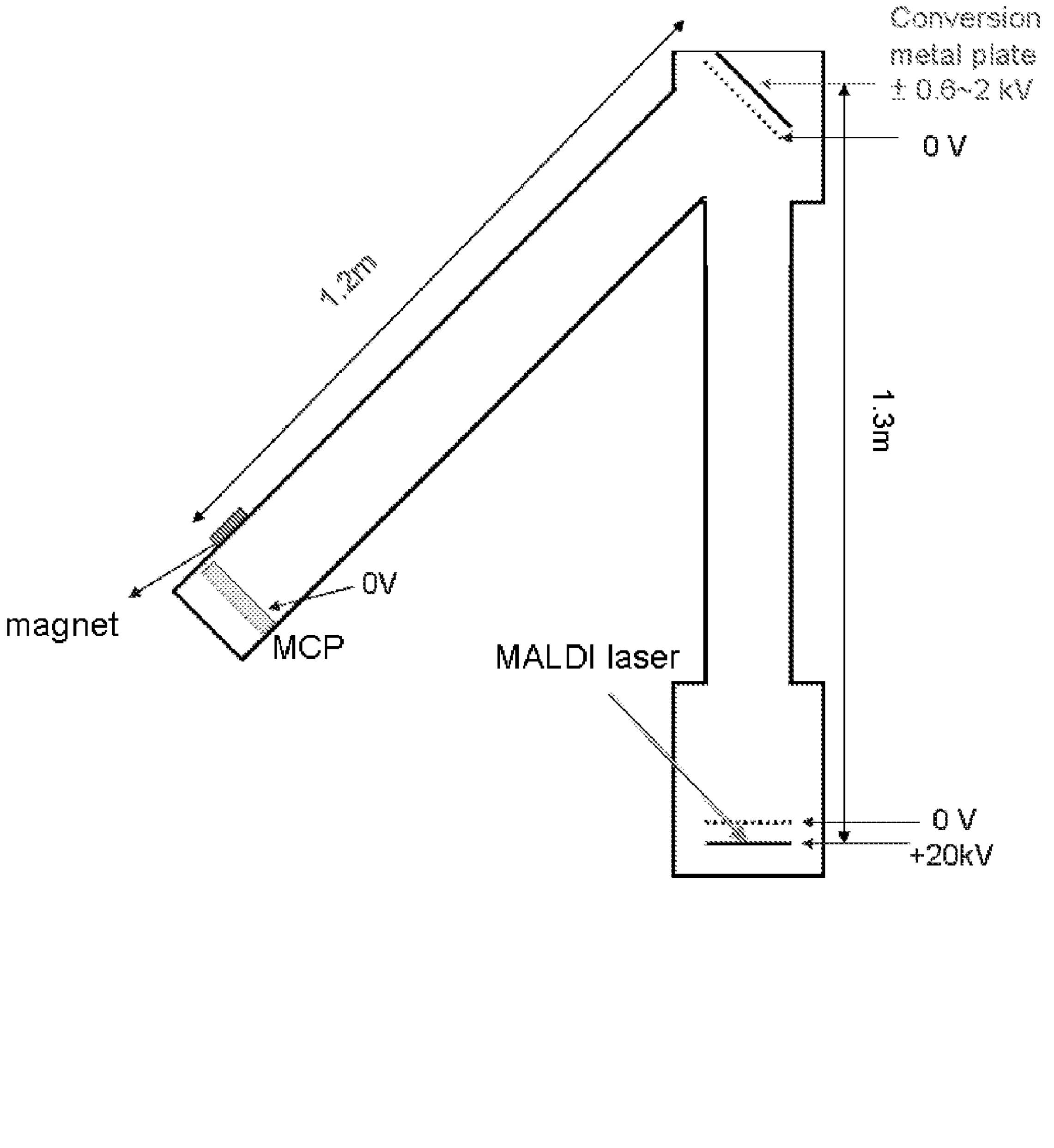
FIG. 10 shows a schematic of an embodiment of a mass spectrometer assembled to identify secondary ions.

A mass spectrometer was assembled to identify secondary ions and is shown in FIG. 10. To obtain increased resolution of secondary ions, the voltage of the conversion dynode was decreased and the length of the installing TOF was increased.

Upon impact, a high kinetic energy biomolecule transfers to thermal energy in the impacting area of the single biomolecule. For IgG ions with 28 keV (150K Da, cross section=17×12 nm), the local surface temperature can be calculated as shown below. See e.g., Wells, T. N.; Stedman, M.; Leatherbarrow, R. J. *Ultramicroscopy* 1992, 42, 44. Assuming that kinetic energy is totally transferred to thermo energy when single IgG ion collides on CsI surface: m×Cp×ΔT=kinetic energy of single biomolecule. The parameters are: CsI lattice length=0.457 nm, CsI m.w.=259.8 g/mole, CsI lattice energy=6.04 eV, CsI heat capacity=0.201 J/gK, IgG cross section=17×12 nm, IgG kinetic energy=28 keV.

$$Cs \text{ and } I \text{ atom number covered by single } IgG = \frac{17\times 12}{0.457\times 0.457} \approx 977$$

$$\Delta T = 53000(\text{K}) T = \Delta T + 300 = 53300(\text{K})$$

The temperature needed for ionizing the Cesium is about 1300K, so the local temperature form bombardment must be high enough to produce violent ionization. See e.g., Alton, *Rev. Sci. Instrum.* 1988, 59, 1039-1044. This estimate agreed with our observation that secondary ion emission coefficient ($\gamma_i$) is much larger than one.

Figure 11:
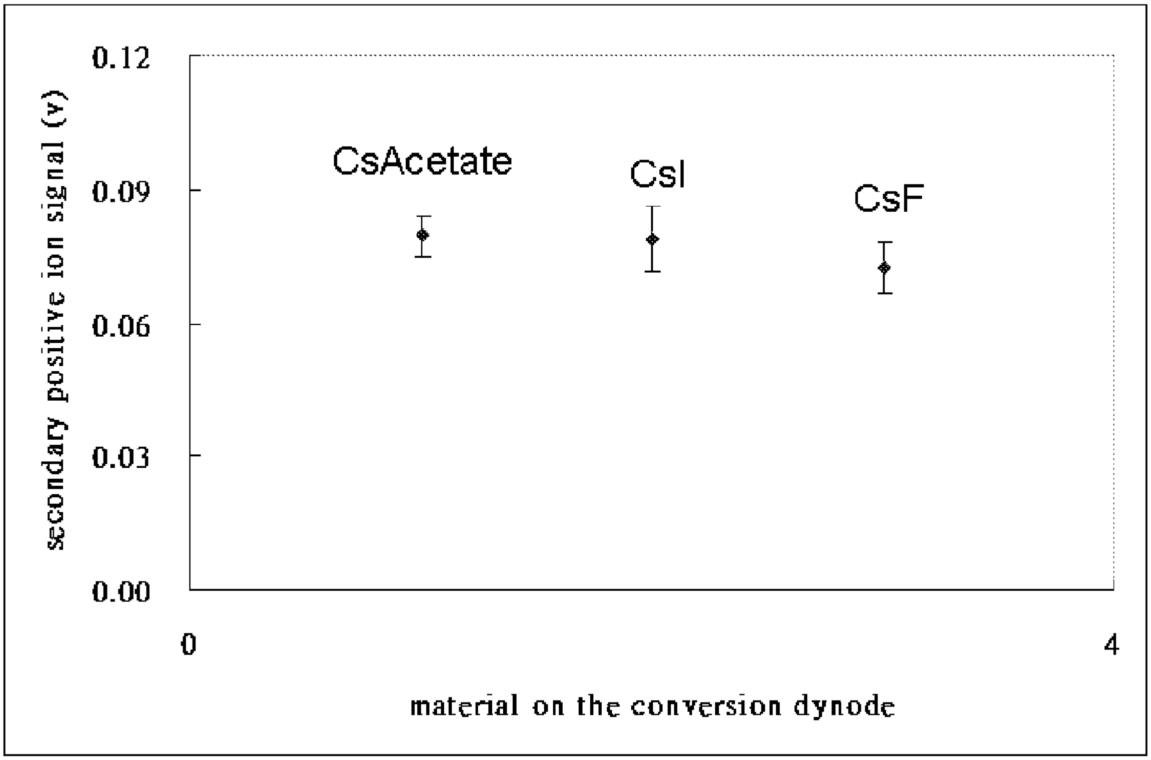
FIG. 11 shows Cs ion emission for CsI, $CsCH_3COO$, and CsF with C60 bombardment. The bond energies were 6.04 eV, 6.96 eV, and 10 eV.

To test the bond breaking model, Cs ion emission for CsI, $CsCH_3COO$, and CsF were compared with C60 bombardment. The bond energies were 6.04 eV, 6.96 eV, and 10 eV. In FIG. 11, Cs ion signal of CsI and $CsCH_3COO$ are similar and CsF is the smallest. This trend was the same as the trend of their bond energies, so the bond breaking model is applicable in our case.

Figure 12:
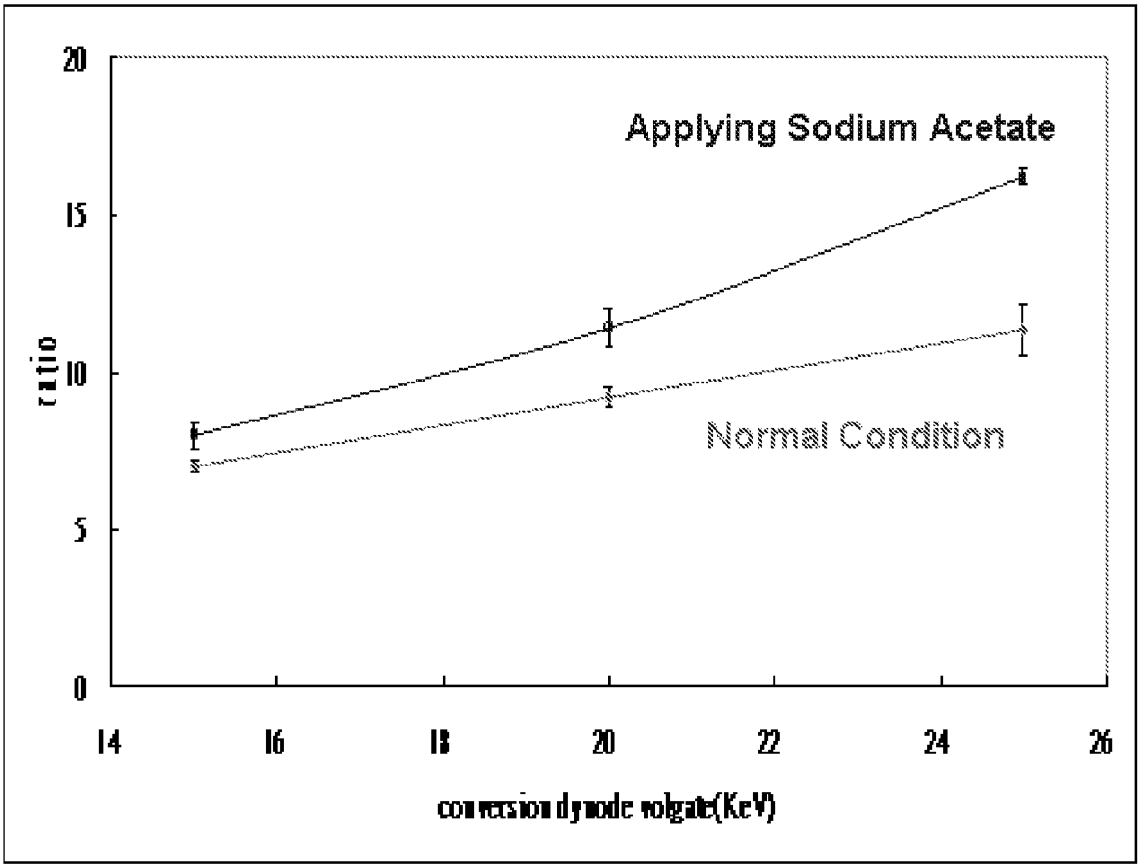
FIG. 12 shows experimental data showing that a surface having sodium acetate was superior for cytochrome c (12.4 kDa) bombardment. The application of an ionic compound to the surface increased the $\gamma_i$ value for secondary ion conversion.

Lastly, it was determined that secondary ion emission coefficient ($\gamma_i$) was increased when an ionic compound was placed on the surface. In FIG. 12, the surface having sodium acetate was better than normal condition while cytochrome c (12.4 kDa) was bombarded. The application of an ionic compound to the surface increased the $\gamma_i$ value for secondary ion conversion.

Without further elaboration, it is believed that one skilled in the art can, based on the above description, utilize the present invention to its fullest extent. The following specific embodiments are, therefore, to be construed as merely illustrative, and not limitative of the remainder of the disclosure in any way whatsoever.

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

From the above description, one skilled in the art can easily ascertain the essential characteristics of the present invention, and without departing from the spirit and scope thereof, can make various changes and modifications of the invention to adapt it to various usages and conditions. Thus, other embodiments are encompassed within the scope of the claimed invention.

All publications and patent applications cited in this specification are herein incorporated by reference as if each individual publication or patent application were specifically and individually indicated to be incorporated by reference.

What is claimed is:

1. A method for obtaining the mass spectrum of a single macromolecular ion in a mass spectrometer, the method comprising:

creating macromolecular primary ions in an ion trap by ionization of a macromolecule;

ejecting half of the macromolecular primary ions for detection with a first charge detector;

ejecting half of the macromolecular primary ions to impact upon a conversion dynode, thereby creating secondary ions for detection with a second charge detector identical to the first charge detector; and determining the secondary ion conversion coefficient of the macromolecular ion.

2. The method of claim 1, further comprising using the secondary ion conversion coefficient to determine the mass spectrum of the single macromolecular ion.

3. The method of claim 1, wherein the macromolecule is a biomolecule, an organic polymer, an inorganic cluster, or a nanoparticle.

4. The method of claim 1, wherein the macromolecule has a mass of from about 10 kDa to about 10,000 kDa.

5. The method of claim 1, wherein the conversion dynode is coated with a salt or alkali metal salt.

6. The method of claim 1, wherein the conversion dynode is coated with NaI, CsI, or $CH_3COONa$.

7. The method of claim 1, wherein the ionization is MALDI, electrospray ionization, laser ionization, thermospray ionization, thermal ionization, electron ionization, chemical ionization, inductively coupled plasma ionization, glow discharge ionization, field desorption ionization, fast atom bombardment ionization, spark ionization, or ion attachment ionization.

8. The method of claim 1, wherein the mass spectrum of the single macromolecular ion is quantitative.

9. The method of claim 1, wherein the secondary ion emission coefficient for the macromolecule is greater than 3.

10. The method of claim 1, wherein the secondary ion emission coefficient for the macromolecule is greater than 10.

11. The method of claim 1, wherein the secondary ion emission coefficient for the macromolecule is greater than 20.

12. The method of claim 1, wherein the average mass of the secondary ions is less than 100 Da.

13. The method of claim 1, wherein the average mass of the secondary ions is less than 500 Da.

14. The method of claim 1, wherein the average mass of the secondary ions is less than 1 kDa.

15. The method of claim 1, wherein the average mass of the secondary ions is less than 5 kDa.

16. The method of claim 1, wherein the average mass of the secondary ions is less than 50 kDa.

17. A method for obtaining the mass spectrum of a single macromolecular ion in a mass spectrometer, the method comprising:

creating macromolecular primary ions;

converting the macromolecular primary ions into secondary ions;

determining the secondary ion conversion coefficient of the primary macromolecular ion;

obtaining the mass spectrum of the secondary ions;

calculating the mass spectrum of the single macromolecular ion using a Poisson distribution based on the peaks in the mass spectrum of the secondary ions.

18. The method of claim 17, wherein the macromolecule is a biomolecule, an organic polymer, an inorganic cluster, or a nanoparticle.

19. The method of claim 17, wherein the macromolecule has a mass of from about 10 kDa to about 10,000 kDa.

20. A mass spectrometer for measuring a single biomolecular ion, the mass spectrometer comprising:

an ionization unit for creating single biomolecular primary ions of a biomolecule;

a first charge detector for directly detecting half of the biomolecular primary ions;

a conversion dynode for converting half of the biomolecular primary ions to secondary ions; and a second detector with charge amplification for detecting the secondary ions.

21. The mass spectrometer of claim 20, wherein the biomolecule has a mass of from about 10 kDa to about 10,000 kDa.

22. The mass spectrometer of claim 20, wherein the conversion dynode is coated with NaI, CsI, or $CH_3COONa$.

23. The mass spectrometer of claim 20, wherein the ionization is by MALDI, electrospray ionization, laser ionization, thermospray ionization, thermal ionization, electron ionization, chemical ionization, inductively coupled plasma ionization, glow discharge ionization, field desorption ionization, fast atom bombardment ionization, spark ionization, or ion attachment ionization.

24. The mass spectrometer of claim 20, wherein the mass spectrum of the single biomolecular ion is quantitative.

25. The mass spectrometer of claim 20, wherein the secondary ion emission coefficient for the biomolecule is greater than 3.

26. The mass spectrometer of claim 20, wherein the secondary ion emission coefficient for the biomolecule is greater than 10.

27. The mass spectrometer of claim 20, wherein the secondary ion emission coefficient for the biomolecule is greater than 20.

28. The mass spectrometer of claim 20, wherein the average mass of the secondary ions is less than 100 Da.

29. The mass spectrometer of claim 20, wherein the average mass of the secondary ions is less than 500 Da.

30. The mass spectrometer of claim 20, wherein the average mass of the secondary ions is less than 1 kDa.

31. The mass spectrometer of claim 20, wherein the average mass of the secondary ions is less than 5 kDa.

32. The mass spectrometer of claim 20, wherein the average mass of the secondary ions is less than 50 kDa.

* * * * *